United States Patent

Hellbarth et al.

[15] 3,646,449

[45] Feb. 29, 1972

[54] INPUT STAGE FOR A RECEIVER, PARTICULARLY FOR THE MEDIUM WAVE

[72] Inventors: Heinz Hellbarth, Wetzlar; Wolfram Wendel, Niederbiel; Alfred Schulz, Volpertshausen, all of Germany

[73] Assignee: U.S. Philips Corporation, New York, N.Y.

[22] Filed: Apr. 21, 1970

[21] Appl. No.: 30,432

[30] Foreign Application Priority Data

Apr. 22, 1969 Germany ......................P 19 19 625.9

[52] U.S. Cl. ..............................325/383, 325/387, 325/413, 325/462, 325/488, 334/15

[51] Int. Cl. ..........................................................H04b 1/18

[58] Field of Search ..............334/14, 15; 325/387, 376, 413, 325/488, 383, 462, 465

[56] References Cited

UNITED STATES PATENTS

| | | | |
|---|---|---|---|
| 3,110,004 | 11/1963 | Pope | 334/15 |
| 3,517,352 | 6/1970 | Marshall et al. | 334/15 |
| 3,354,397 | 11/1967 | Wittig | 325/459 |

*Primary Examiner*—Robert L. Griffin
*Assistant Examiner*—Kenneth W. Weinstein
*Attorney*—Frank R. Trifari

[57] ABSTRACT

A receiver input stage for the reception of signals in a broad frequency range comprising an input resonant circuit and an output resonant circuit that is identical to the antenna-input circuit. The input and output circuits are coupled and tuned by means of variable capacity coupling and tuning diodes respectively.

10 Claims, 1 Drawing Figure

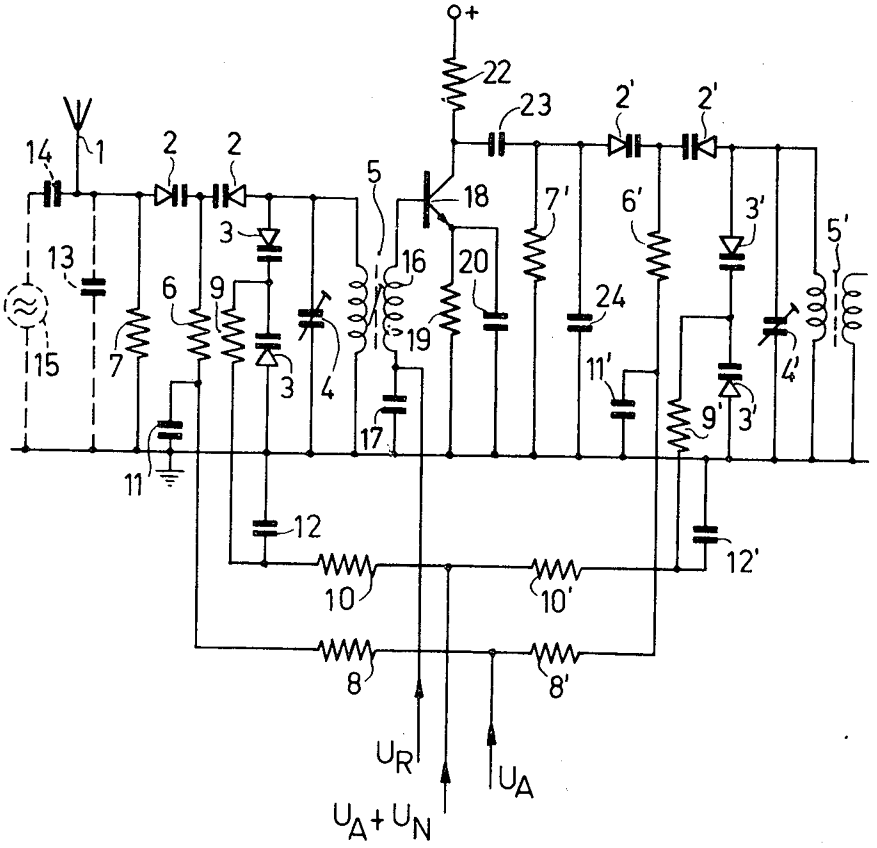
INVENTORS
HEINZ HELLBARTH
WOLFRAM WENDEL
ALFRED SCHULZ
BY
Frank R. [signature]
AGENT

INPUT STAGE FOR A RECEIVER, PARTICULARLY FOR THE MEDIUM WAVE

The invention relates to an input stage for a receiver for the reception of signals from a broad frequency range particularly the medium-wave range comprising and having an input resonant circuit and an output resonant circuit which are tunable by means of variable capacity tuning diodes.

Up till now such resonant circuits had been tuned to the desired input frequency in many cases by varying the circuit inductance (variometer) because the aerial impedance which is predominantly capacitive due to the short useful aerial height especially in motorcar radios can thus be coupled to the input circuit in the easiest manner. The ratio between the voltage on the input circuit and the aerial voltage then is mainly frequency-independent. However, a drawback of this known stage is the expensive mechanism for the variation of the variometer.

In another known input stage including resonant circuits tuned by a variable capacity diode this drawback is not present, but instead it must be taken into the bargain that the ratio between the voltage on the input circuit and the aerial voltage increases with the frequency. Particularly in motorcar radios such a circuit, for example, for the medium wave range of 535–1605 kHz. cannot substantially be obtained with the commonly used variable capacity diodes, also because the cable, wiring and aerial capacitances connected parallel to the input resonant circuit limit the tuning range to a too great extent. When the cable and wiring capacitances are, for example, 80 pf., tuning over the range of 535–1,605 kHz. is only possible if the tuning capacitance is variable between 8 and 800 pf.; if the variation of the circuit capacitance is less than 782 pf., a complete tuning of the frequency range is impossible.

An input stage is already known from the book by Pietsch "Lehrbuch der Funkemfangstechnik," 1950, page 238, wherein the aerial is coupled to the input circuit through a variable capacitor. During tuning this coupling capacitor is varied together with the tuning capacitor of comparatively high value. In this manner it is achieved that the voltage across the input resonant circuit becomes substantially independent of the tuning in case of a constant aerial voltage.

It has been found from experiments that perfect tuning is still possible in this circuit even when the wiring and cable capacitances are in the order of the tuning capacitance. This result can be explained as follows. At high frequencies and at minimum tuning capacitance the capacitance of the coupling capacitor is also at a minimum. As a result the capacitances of the aerial and of the cable and wiring in the input circuit become weakly active; at low frequencies and at maximum tuning capacitance, the coupling capacitance is also at a maximum so that the influence of the cable and wiring capacitances on the input circuit is comparatively great. This results in the sweep of the capacitance of the resultant circuit capacitance (= tuning capacitance + the cable and wiring capacitances active in the circuit) being only slightly lower than the sweep of the capacitance of the tuning capacitor alone. Hence the tuning range is then hardly limited by the external capacitance connected parallel to the circuit. However, the synchronism between the input resonant circuit of the input stage and its output resonant circuit thereof is a problem in such a stage, because the tuning of the input circuit is not only determined by the tuning capacitor but also by the coupling capacitor and the fixed external capacitances.

This problem of synchronism is solved in an input stage for a receiver of the kind described above in that the aerial is coupled in known manner through a capacitor to the input circuit, the capacitance of this capacitor being varied in the same sense during tuning as that of the tuning diode and in that the output circuit is substantially an electrical imitation of the aerial- and input-circuit.

In order that the invention may be readily carried into effect, an embodiment thereof will now be described in detail by way of example with reference to the accompanying diagrammatic drawing.

The drawing shows an input stage of a motorcar radio suitable for medium-wave reception. The signals received by aerial 1 are applied through two series-arranged variable capacity diodes 2, the cathodes of which are interconnected and which serve as coupling capacitors, to the input circuit which comprises the parallel arrangement of a trimming capacitor 4 of 20 pf., a circuit coil 5 and two series-arranged tuning diodes 3, interconnected by their cathode.

The cutoff voltage $U_A$ for the two diodes 2 is applied to their common point through the series arrangement of two resistors 8 (100 kohms) and 6 (470 kohms) the common point of which is connected to earth with respect to alternating voltage by means of a capacitor 11 of 0.1 $\mu$f. The anode of one variable capacity diode 2 connected to the aerial 1 is connected to earth through a resistor 7 of 470 kohms. Similarly, the anodes of the tuning diodes 3 are respectively connected to earth directly and through the circuit coil 5, and the tuning voltage is applied to the cathodes of the tuning diodes 3 through the resistor 9 of 470 kohms and the resistor 10 of 100 kohms, the common point of which is connected to earth through capacitor 12 of 0.1 $\mu$f. This tuning voltage comprises a component $U_A$ which is also applied to the variable capacity diodes 2 and a component $U_N$ which serves for the fine tuning of the circuit in order that it becomes, for example, independent of fluctuations in temperature. Circuit arrangements for generating a fine control voltage are known per se and do not feature in this patent application for which reason they are not further referred to.

As already stated, the capacitance active in the input circuit is not only determined by the capacitance of the tuning diode 3 but also by the coupling variable capacity diodes 2 and the cable and wiring capacitances 13 shown by a broken line in the FIGURE and by the capacitance 14 of the aerial 1. The equivalent circuit of the aerial is shown in the FIGURE by means of the said capacitance 14 and a voltage generator 15. The sum of the capacitances 13 and 14 coupled through the variable capacity diode 2 to the input circuit may be, for example, 120 pf., while the maximum capacitance of the tuning diodes 3 which are preferably of the same type as the coupling variable capacity diodes 2 may be, for example, only 300 pf. In spite of this comparatively high capacitance connected parallel to the circuit, the sweep of the capacitance of the resultant circuit capacitance is not noticeably limited because the external capacitances 13 and 14 can only become active to a slight extent in the circuit at high frequencies, that is to say, at the minimum capacitance of the tuning diodes 3. In addition the mentioned advantage occurs, namely that the ratio between the aerial voltage and the voltage on the input circuit becomes substantially independent of the tuning of the input circuit.

One end of the coupling winding 16 of the circuit coil 5 is connected to earth through a capacitor 17 of 0.1 $\mu$f. and the other end is connected to the base of a transistor 18 the emitter branch of which includes the parallel arrangement of a resistor 19 of 100 ohms and a capacitor 20 of 0.1 $\mu$f. and the collector of which is connected through a resistor 22 of 3.3 kohms to the positive terminal of the battery. The base bias $U_R$ is provided by a voltage source not further shown and is applied to the junction of the coupling winding 16 and the capacitor 17. The output circuit is coupled to the collector of transistor 18 through a capacitor 23 of 47 pf. Due to this relatively loose coupling the damping influence of the collector resistor 22 on the output circuit is reduced. The output circuit has a structure similar to that of the input circuit for which reason the separate elements 2' to 12' have corresponding reference numerals as those of the separate elements of the input circuit (2–12). In this case the capacitances 13 and 14 active at the input circuit are replaced by a fixed capacitance 24 of approximately 120 pf. In this manner a very accurate synchronism between the input and output circuits is achieved and in addition the occurring increase of the output voltage at high frequencies is avoided in circuits which are tuned by a capacitor.

As regards the signal-to-noise ratio it may be required to limit the control range of the coupling variable capacity diodes. This may be effected by either shunting each of these diodes 2 and 2' by a capacitor having a constant capacitance, or by reducing the cutoff voltage $U_A$ for the coupling diodes relative to the tuning voltage $U_A+U_N$ by means of a potential divider. The coupling capacitance is then higher and the coupling is stronger at high tuning voltages.

The synchronism between the input and output circuits on the one hand and the oscillator circuit not further shown controlling the mixer stage on the other hand can be obtained without difficulty if also the oscillator circuit, similarly as the output circuit 2–12', is made equal to the input circuit, it being possible to obtain the required frequency distance by means of a so-called padding capacitor.

What is claimed is:

1. A receiver input stage for the reception of signals in a broad frequency range comprising input means for an antenna, a variable capacity diode coupled to said input means, an input resonant circuit connected to said variable capacity coupling diode, an output resonant circuit coupled to said input resonant circuit, said output resonant circuit comprising electrical components identical to those employed in the combination of the antenna and input resonant circuits, wherein the output resonant circuit includes a capacitor substantially equivalent to the capacitance of the antenna, variable capacity diodes for tuning said input and output resonant circuits, and means for varying the capacitance of the variable capacity coupling diode in the same sense during tuning as the capacitance of the variable capacity tuning diodes.

2. A receiver input stage as claimed in claim 1 wherein at high tuning voltages the capacitance of the variable capacity coupling diode is higher than the capacitance of the variable capacity tuning diodes.

3. A receiver input stage as claimed in claim 1 wherein the output resonant circuit comprises a variable capacity tuning diode and a fixed capacitance connected across said variable capacity tuning diode through at least one variable capacity coupling diode, the signals being supplied to the junction of said fixed capacitance and said variable capacity coupling diode.

4. A receiver input stage as claimed in claim 3 wherein said signals are supplied to said junction through a capacitor of comparatively low value.

5. A receiver input stage as claimed in claim 1 wherein said broad frequency range comprises the medium-wave range.

6. A receiver input stage as claimed in claim 1 further comprising amplifier means between said input and output resonant circuits.

7. A receiver input stage as claimed in claim 1 wherein said output resonant circuit comprises the oscillator circuit of a mixer oscillator.

8. A receiver input stage as claimed in claim 1 further comprising control means for varying the capacitance of said variable capacity coupling diode and said variable capacity tuning diode.

9. A receiver input stage as claimed in claim 8 wherein said control means comprises a circuit for producing a fine control voltage, the voltage of said control means being applied to the variable capacity coupling diodes and the sum of the voltage of said control means and the fine control voltage being applied to said variable capacity tuning diodes.

10. A receiver input stage as claimed in claim 8 wherein said control means comprises a circuit for producing a fine control voltage, the sum of the voltage of said control means and the fine control voltage being applied to the variable capacity coupling diode and the variable capacity tuning diodes.

* * * * *